(12) United States Patent
Tanaka

(10) Patent No.: US 6,882,050 B2
(45) Date of Patent: Apr. 19, 2005

(54) SEMICONDUCTOR DEVICE AND METHOD OF MANUFACTURING SAME

(75) Inventor: Yasuo Tanaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 54 days.

(21) Appl. No.: 10/623,748

(22) Filed: Jul. 22, 2003

(65) Prior Publication Data

US 2004/0140558 A1 Jul. 22, 2004

(30) Foreign Application Priority Data

Nov. 1, 2002 (JP) ........................................ 2002-319597

(51) Int. Cl.[7] .......................... H01L 23/48; H01L 23/52; H01L 29/40
(52) U.S. Cl. ........................ 257/737; 257/759; 257/792; 257/793
(58) Field of Search ................................. 257/737, 738, 257/758, 759, 791, 792, 793

(56) References Cited

U.S. PATENT DOCUMENTS 6,605,834 B1 * 8/2003 Lee ............................. 257/295
6,624,504 B1 * 9/2003 Inoue et al. .................. 257/668
2002/0030258 A1 3/2002 Fukasawa et al.

FOREIGN PATENT DOCUMENTS

| JP | 10-079362 | 3/1998 |
| JP | 2000-022052 | 1/2000 |

* cited by examiner

*Primary Examiner*—Ngân V. Ngô
(74) *Attorney, Agent, or Firm*—Volentine Francos & Whitt, PLLC

(57) ABSTRACT

A semiconductor device having bump electrodes electrically connected to connection pads formed on a semiconductor chip of the semiconductor device, tips of the bump electrodes exposing at a surface of a sealing resin film formed on a surface of the semiconductor chip, wherein the sealing resin film is comprised of a low-elastic resin layer formed on the surface of the semiconductor chip and a high-elastic resin layer formed on a surface of the low-elastic resin layer and having an elastic coefficient higher than that of the low-elastic resin layer, a thickness of the high-elastic resin layer being between 5 $\mu$m and 45 $\mu$m.

27 Claims, 5 Drawing Sheets

⇩ LAYER THICKNESS REDUCTION BY CURE

FIG.6

| MATERIAL | YOUNG'S MODULUS | POISSON'S RATIO | MASS DENSITY | INSTANTANEOUS LINEAR EXPANSION COEFFICIENT | EQUIV. (Von Misers) TNESIL YIELD STRESS | EQUIV. 10 cycles TNESIL YIELD STRESS |
|---|---|---|---|---|---|---|
| | Mpa | | g/mm³ | ppm | | |
| HIGH-ELASTIC RESIN | 2.15600+4 | 0.24000+0 | 1.95000+3 | 8.50000-6 | 1.09900+1 | 0.00000+0 |
| LOW-ELASTIC RESIN | 1.20000+3 | 0.30000+0 | 1.86000+3 | 1.40000-5 | 0.00000+0 | 0.00000+0 |
| Si | 1.70000+5 | 0.26000+0 | 2.32800+3 | 2.60000-6 | 0.00000+0 | 0.00000+0 |
| Sn-Pb (63:37) | 2.46760+4 | 0.33000+0 | 8.30000+3 | 2.40000-5 | 4.06590+1 | 0.00000+0 |
| FR-4 | 1.85710+4 | 2.50000+0 | 1.85000+3 | 1.50000-5 | 0.00000+0 | 0.00000+0 |
| Cu | 1.30000+4 | 0.29000+0 | 8.93000+3 | 1.65000-5 | 0.00000+0 | 0.00000+0 |
| POLYIMIDE | 3.80000+4 | 0.25000+0 | 1.85000+3 | 2.00000-5 | 0.00000+0 | 0.00000+0 |

TEMPERATURE DEPENDENCE OF INSTANTANEOUS LINEAR EXPANSION COEFFICIENT OF LOW-ELASTIC RESIN

| TEMPERATURE | INSTANTANEOUS LINEAR EXPANSION COEFFICIENT |
|---|---|
| -25°C | 1.40000-05 |
| 19.9999°C | 1.40000-05 |
| 20°C | 7.00000-05 |
| 125°C | 7.00000-05 |

TEMPERATURE DEPENDENCE OF Sn-Pb(63:37) SOLDER

| TEMPERATURE | YIELD STRESS | YOUNG'S MODULUS | WORK HARDENING COEFFICIENT |
|---|---|---|---|
| -65°C | 4.065900+01 | 2.467600+04 | 1.000000+00 |
| 20°C | 2.776712+01 | 2.215804+04 | 0.895200+00 |
| 50°C | 2.181702+01 | 1.309339+04 | 4.065900+00 |
| 100°C | 1.289188+01 | 5.539510+04 | 0.252390+00 |
| 150°C | 3.966732+00 | 3.021551+03 | 0.128789+00 |

# SEMICONDUCTOR DEVICE AND METHOD OF MANUFACTURING SAME

FIELD OF THE INVENTION

The present invention relates to a semiconductor device and method of manufacturing the same, and specifically relates to a semiconductor device of WCSP (Wafer level Chip Size Package) structure and method for manufacturing the semiconductor device of the WCSP structure.

BACKGROUND OF THE INVENTION

Efforts are being made in miniaturization and integration of semiconductor devices to meet the demand for electronic devices of miniature sizes in recent years. Thus, the semiconductor device of the WCSP structure, i.e. a semiconductor device whose outer shape is made as close to a semiconductor chip as possible to reduce the size of the semiconductor device has been proposed.

The semiconductor device of the WCSP structure needs densely arranged output terminals for connection with the outside. So, column-shaped terminals electrically connected to connection pads formed on a chip surface of the semiconductor device and projecting vertically from the chip surface are used as such output terminals. Generally, such column-shaped terminals are referred to as column electrodes, projecting electrodes, or bump electrodes.

When the semiconductor device of the WCSP structure is mounted on a circuit board, the tips of the columnar electrodes are soldered to connection pads provided on the surface of the circuit board, and after that, the gap between the semiconductor device and the circuit board is filled with a sealing resin.

Since it is difficult and takes much time to fill the narrow gap with the sealing resin uniformly, it has been proposed to form a resin film in advance on the chip surface of the semiconductor device to such a thickness that the tips of the column electrodes are exposed at the surface of the resin film, as disclosed in Japanese Laid-Open Patent No. 10-79362, for example.

In this case, it is preferable to form the sealing film from a resin of high elasticity (hard resin) for increasing mechanical strength of the columnar electrode section of the semiconductor device. However, for absorbing distortion occurring at the solder joint section because of the difference in thermal expansion coefficients between the semiconductor chip and the circuit board and preventing cracks from occurring at the solder joint section, it is preferable to form the sealing film from a resin of low elasticity (soft resin). To increase the reliability of the semiconductor device, it is necessary to achieve both of them. So, a double-layer structure in which the sealing resin film is comprised of a soft resin layer and a hard resin layer is proposed in the Japanese Laid-Open Patent No. 10-79362.

However, employing such a double-layer structure does not necessary provide a reliable semiconductor device, since the effects of the strength improvement of the columnar electrode section and the distortion absorption vary with the thicknesses of the hard resin layer and the soft resin layer as well as the ratios of them to the total thickness. In addition, although the Japanese Laid-Open Patent No. 10-79362 suggests forming the double-layer structure by a compression moulding process or a transfer moulding process, it is very difficult to form such a double-layer structure by such processes. To be more specific, technically, it is very difficult to form even the first one of the two resin layers by any of such moulding processes, and still more difficult to form a stack of the two resin layers by one resin-filling process.

The present invention has been made with an object of providing a reliable semiconductor device in which the columnar electrode section has sufficient strength, and cracks due to the difference in thermal expansion coefficients between the semiconductor chip and the circuit board are prevented from occurring. Another object of the present invention is to provide such a semiconductor device at low cost.

SUMMARY OF THE INVENTION

The object of the invention is achieved by a first semiconductor device having bump electrodes electrically connected to connection pads formed on a semiconductor chip, tips of the bump electrodes exposing at a surface of a sealing resin film formed on a surface of the semiconductor chip, wherein the sealing resin film is comprised of a low-elastic resin layer formed on the surface of the semiconductor chip and a high-elastic resin layer formed on a surface of the low-elastic resin layer and having an elastic coefficient higher than that of the low-elastic resin layer, a thickness of the high-elastic resin layer being between 5 $\mu$m and 45 $\mu$m.

The object of the invention is also achieved by a second semiconductor device having bump electrodes electrically connected to connection pads formed on a semiconductor chip, tips of the bump electrodes exposing at a surface of a sealing resin film formed on a surface of the semiconductor chip, wherein the sealing resin film is comprised of a low-elastic resin layer formed on the surface of the semiconductor chip and a high-elastic resin layer formed on a surface of the low-elastic resin layer and having an elastic coefficient higher than that of the low-elastic resin layer, and the surface of the low-elastic resin layer has sloping sections at the vicinities of the bump electrodes, thickness of the sloping sections decreasing with distance from the bump electrodes.

The first semiconductor device can be obtained by a manufacturing method in which the low-elastic resin layer is formed by a spin-coating process or a printing process.

The second semiconductor device can be obtained by a manufacturing method in which the low-elastic resin layer is formed by a spin-coating process or a printing process, and the formed low-elastic resin layer undergoes a curing process.

BRIEF DESCRIPTION OF THE DRAWINGS

Embodiments of the invention will now be described by way of example and with reference to the accompanying drawings in which:

FIG. 6 shows constants of materials used for a simulation of distortion amplitude and fatigue life in a joint surface between a columnar electrode and a solder bump.

DESCRIPTION OF THE PREFERRED EMBODIMENT

Figure 1:
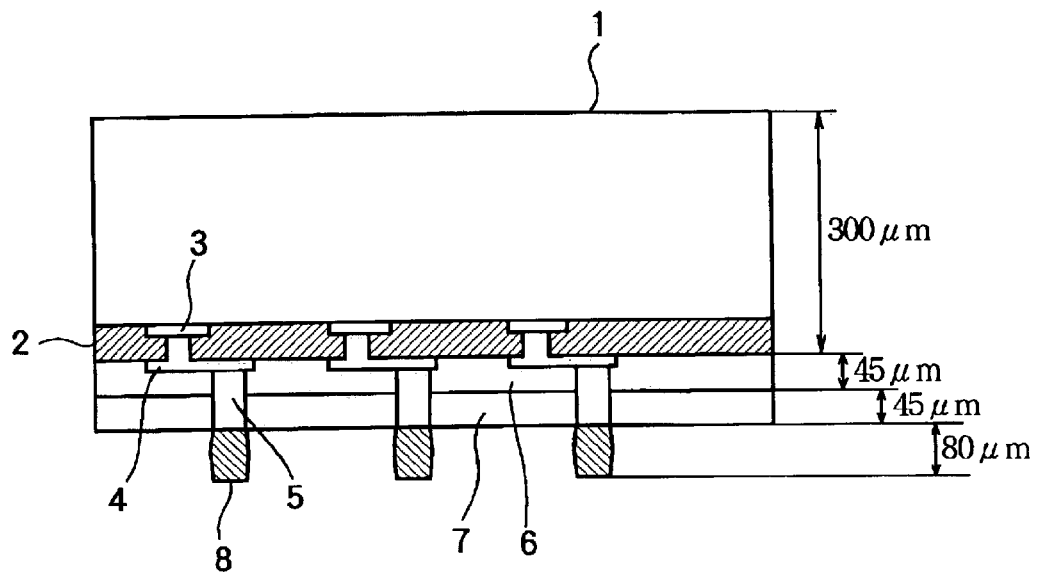
FIG. 1 shows a structure of one embodiment of the semiconductor device of the WCSP structure according to the invention.

FIG. 1 shows a structure of one embodiment of the semiconductor device of the WCSP structure according to the invention. This semiconductor device includes a silicon chip 1 on which connection pads (electrode pads) 3 are formed, an insulating film 2 comprised of polyimide formed on the major surface of the silicon chip 1, columnar electrodes (projecting electrodes, or bump electrodes) 5 electrically connected to the connection pads 3 by wires 4 passing through openings formed in the insulating film 2, a low-elastic resin layer 6 and a high-elastic resin layer 7 stacked on the surface of insulating film 2, and output terminals 8 formed on the tips of the columnar electrodes 5 for connection with a circuit board.

A sealing resign comprising the low-elastic resin layer 6 and the high-elastic resin layer 7 covers the major surface of the chip 1 and the side surfaces of the columnar electrodes 5. The top surfaces of the columnar electrodes 5 are exposed at the surface of the sealing resin.

The low-elastic resin layer 6 is comprised of a resin with a thermal expansion coefficient α1 which is between 8 ppm and 180 ppm and a room-temperature bending elastic modulus E which is between 0.5 Gpa and 4 GPa, such as polyimide, benzocyclamatebutene (BCB: Dow Chemical make), and polybenzaoxazole (PBO: Sumitomo Bakelite make). The high-elastic resin layer 7 is comprised of a resin with a thermal expansion coefficient α1 which is between 5 ppm and 13 ppm and a room-temperature bending elastic modulus E which is between 9 Gpa and 21 GPa, such as epoxy resin.

In this embodiment, the silicon chip 1 is 300 μm thick, the low-elastic resin layer 6 is 45 μm thick, the high-elastic resin layer 7 is 45 μm thick, and the columnar electrodes 5 are 90 μm high. The output terminals 8 comprised of solder for connection with the circuit board project from the surface of the high-elastic resin layer 7 by 80 μm. The above set of numeric values of the thicknesses of the silicon chip, resin layers etc. are just a case in point, and the present invention is not limited thereto.

The low-elastic resin layer 6 can be formed by a spin-coating process or a printing process (screen-printing process or metal-mask-printing process).

Figure 2A:
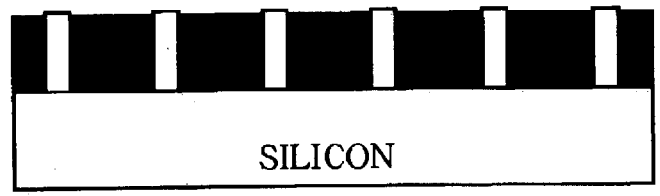
FIG. 2(a) and FIG. 2(b) show a process for forming a low-elastic resin layer of the semiconductor device of FIG. 1 by a spin-coating process.
Figure 2B:
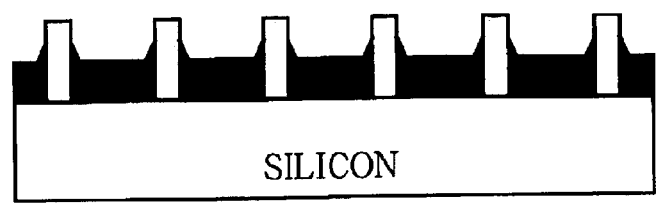

In the case of using the spin-coating process, as shown in FIG. 2, a liquid low-elastic resin is dropped onto the surface of the silicon chip, and then the silicon chip is caused to spin at high velocity so that a uniform low-elastic resin layer is formed (FIG. 2(a)). The thickness of this layer is equal to the height of the columnar electrodes. However, the layer thickness reduces since non-solid matter of the liquid low-elastic resin evaporates in a subsequent curing process (FIG. 2(b)). After the curing process, the surface of the low-elastic resin layer 6 is not flat, but has sloping sections (inclination surfaces) which rise towards the tips of the columnar electrodes in the vicinities of the columnar electrodes.

Accordingly, the thickness of the low-elastic resin layer at the region where the inclination surface is provided decreases with increasing distance from the columnar electrode.

Providing such sloping sections makes it possible to increase the thickness of the low-elastic resin layer at the portions adjacent to the columnar electrodes, thereby enhancing the effect of absorbing the distortion due to the difference in thermal expansion coefficients between the semiconductor chip and the circuit board, and also makes it possible to increase the average thickness of the high-elastic resin layer 7, thereby improving the mechanical strength (bending strength) and increasing its light blocking capability to prevent malfunction of the semiconductor device due to photoelectric effect by the ambient light.

The amount of reduction of the layer thickness depends on the solid matter content of the low-elastic resin, and accordingly the low-elastic resin layer can be formed to any desired thickness with ease by setting the solid matter content at an appropriate value. The sealing resin film of the double-layer structure can be obtained by forming a high-elastic resin layer 7 on the low-elastic resin layer 6 by a transfer molding process, for example.

Figure 3:
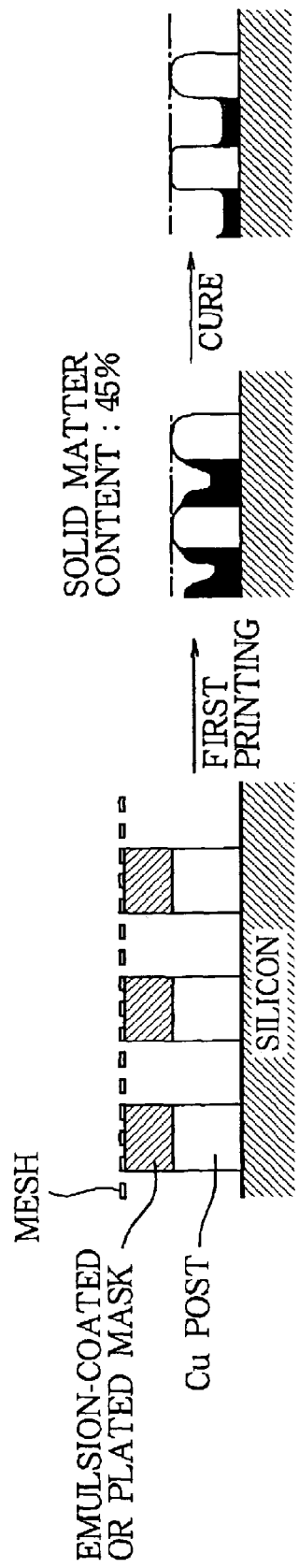
FIG. 3 shows a process for forming a low-elastic resin layer of the semiconductor device of FIG. 1 by a screen-printing process.

In the case of using the screen-printing process, as shown in FIG. 3, emulsion-coated masks or plated masks are put to a mesh member, and the mesh member is set on the semiconductor device such that the masks align with the columnar electrodes. Then, a liquid low-elastic resin is poured to the level of the mesh member. As in the case of the spin-coating process, the layer thickness reduces after a subsequent curing process since liquid matter of the low-elastic resin evaporates. So, the low-elastic resin layer can be formed to any desired thickness with ease by setting solid matter content of the low-elastic resin at an appropriate value. Normally, the low-elastic resin layer is formed one step at a time by carrying out the printing process multiple times. Using such masks enables making the shapes of the sloping sections rising towards the tips of the columnar electrodes keener. Furthermore, since the low-elastic resin layer is formed through a plurality of printing processes and accordingly a layer formed by each one of the printing process is thin, defoaming in the curing process becomes easy.

Figure 4:
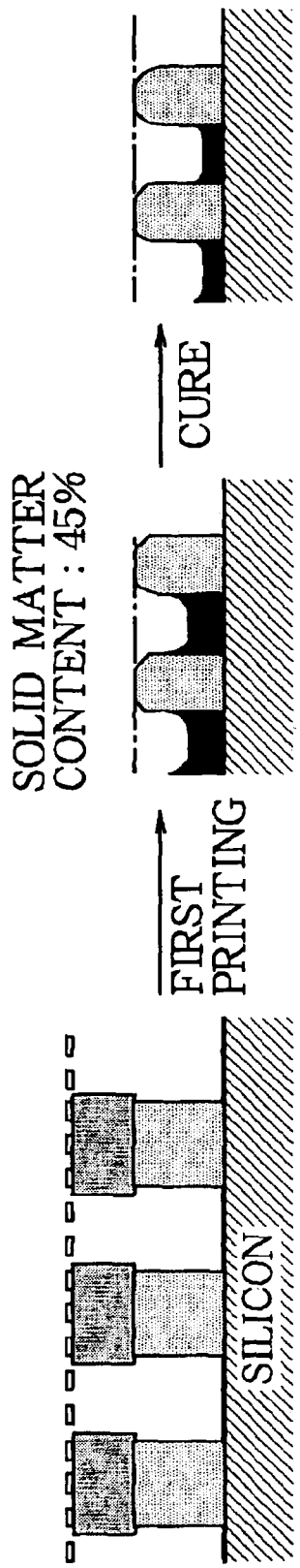
FIG. 4 shows a process for forming a low-elastic resin layer of the semiconductor device of FIG. 1 by a screen-printing process.

Though the diameter of the columnar electrodes is equal to that of the masks in FIG. 3, if the diameter of the masks is made larger than that of the columnar electrodes as shown in FIG. 4, the amount of the low-elastic resin remaining in the vicinity of the tip of each of the columnar electrodes before the curing process becomes small, since the overhanging masks suppress the adhesion of the low-elastic resin to the vicinities of the tips of the columnar electrodes. FIG. 3 and FIG. 4 show cases where the solid matter content of the low-elastic resin is 45%.

Figure 5:
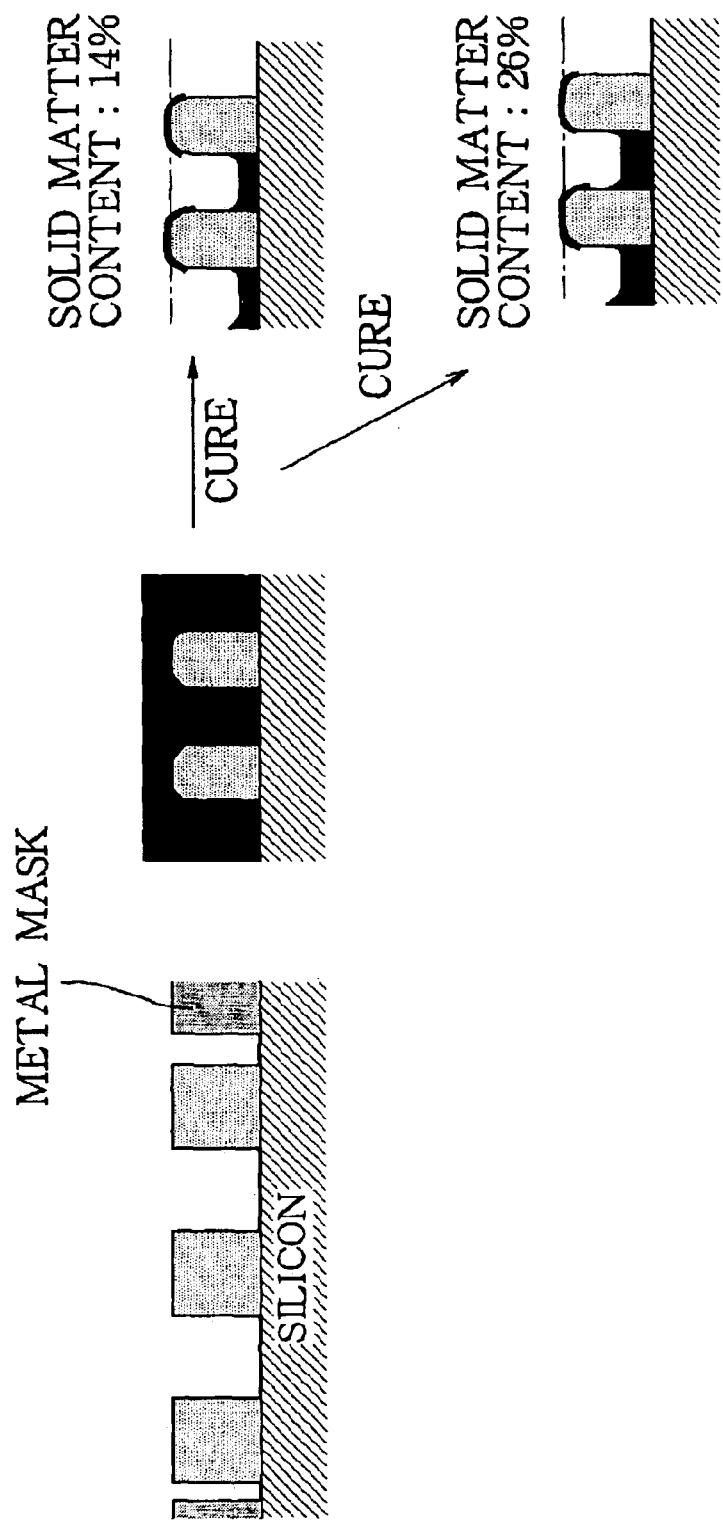
FIG. 5 shows a process for forming a low-elastic resin layer of the semiconductor device of FIG. 1 by a metal-mask-printing process.

In the metal-mask-printing process, as in the case of the screen-printing process, the liquid matter of the low-elastic resin evaporates, and accordingly the layer thickness reduces after a subsequent curing process. So, the low-elastic resin layer can be formed to any desired thickness with ease by setting the solid matter content of the low-elastic resin at an appropriate value. FIG. 5 shows a case where the solid matter content of the low-elastic resin is 14% and a case where the solid matter content of the low-elastic resin is 26%. In the metal-mask-printing process, the low-elastic resin layer is formed at a time by one printing process, so the process time is short compared with the screen-printing process in which the low-elastic resin layer is formed through a plurality of printing processes. In addition, the masks are simple and therefore durable.

After the sealing resin film is formed, solder bumps are formed on the tips of the columnar electrodes. When the columnar electrodes are soldered to connecting pads on the circuit boards, there arise large distortion and stress in the joint surfaces between the columnar electrodes and the solder bumps. Table 1 shows distortion amplitude Δε in the joint surface between the columnar electrode and the solder bump obtained through simulation for each of the single-layer structure and the double-layer structure (for a case where the ratio of the thickness of the low-elastic resin layer to the thickness of the high-elastic resin layer is 1 to 1 and a case where it is 3 to 1). Each of the numerical values inside the parentheses represents the distortion amplitude when the distortion amplitude in the case of the single-layer structure is normalized to 1. Table 1 also shows a fatigue life Nf for each of the structures when the fatigue life in the case of the single-layer structure is normalized to 1. FIG. 6 shows constants of the materials used for the simulation. In this simulation, the solder material is Sn—Pb (63:37), the circuit board material is FR-4, the columnar electrode material is Cu, the low-elastic resin is polyimide, the high-elastic resin is epoxy resin, and the insulating film of the silicon chip is polyimide. In FIG. 6, the last digit of each of the numerics represents power of 10 (for example, +4 represents $10^4$, and −5 represent $10^{-5}$)

TABLE 1

|  | single-layer structure | double-layer structure | |
|---|---|---|---|
|  |  | LER layer–HER layer (1:1) | LER layer–HER layer (3:1) |
| distortion amplitude Δε | 0.0128 (1.00) | 0.0049 (0.38) | 0.0032 (0.25) |
| fatigue life Nf Coffin-Manson's expression $Nf = C \times (\Delta\epsilon)^{-2}$ C: constant, n = 2 | 1.00 | 6.93 | 16.0 |

LER layer: low-elastic resin layer
HER layer: high-elastic resin layer

It is apparent from Table 1 that, as compared to the single-layer structure, the double-layer structure provides small distortion amplitude and long fatigue life. It is also apparent from Table 1 that, even in the same double-layer structure, as compared to the case where the ratio of the thickness of the low-elastic resin layer to the thickness of the high-elastic resin layer is 1 to 1, the case where it is 3 to 1 provides small distortion amplitude and long fatigue life.

The distortion amplitude is a measure representing a magnitude of distortion occurring between two members having different linear expansion coefficients, and it depends on the difference in the length variations with the temperature between the two members.

It has been found through an experiment that, when the length of the columnar electrodes is approximately 90 μm, the length of the output terminals is approximately 80 μm, and the total thickness of the sealing resin film is approximately 90 μm, the strength of the columnar electrode sections is insufficient if the thickness of the high-elastic resin layer is less than 5 μm, and the thickness of the high-elastic resin layer has to be between 5 μm (preferably more than 10 μm and 45 μm in order to obtain sufficient strength. Also it has been found as well that the probability of the solder junctions having cracks decrease as the thickness of the low-elastic resin layer increases. Accordingly, if the height of the columnar electrodes is 90 μm, it is desirable that the thickness of the high-elastic resin layer is between 10 μm and 20 μm and the thickness of the low-elastic resin layer is between 70 μm and 80 μm, and that the ratio of the thickness of the low-elastic resin layer to the thickness of the high-elastic resin layer is set between 3.5 and 8.

In the above-described embodiment, the columnar electrodes are provided with output terminals formed from solder at their tips, however, it is permissible to lengthen the columnar electrodes and to use the lengthened portions of the columnar electrodes as the output terminals for connection with the circuit board.

The above explained preferred embodiment is exemplary of the invention of the present application which is described solely by the claims appended below. It should be understood that modifications of the preferred embodiments may be made as would occur to one of skill in the art.

What is claimed is:

1. A semiconductor device having bump electrodes electrically connected to connection pads formed on a semiconductor chip, tips of the bump electrodes exposing at a surface of a sealing resin film formed on a surface of the semiconductor chip, wherein
the sealing resin film is comprised of a low-elastic resin layer formed on the surface of the semiconductor chip and a high-elastic resin layer formed on a surface of the low-elastic resin layer and having an elastic coefficient higher than that of the low-elastic resin layer, a thickness of the high-elastic resin layer being between 5 μm and 45 μm.

2. A semiconductor device according to claim 1, wherein a ratio of a thickness of the low-elastic resin layer to the thickness of the high-elastic resin layer is between 3.5 and 8.

3. A semiconductor device according to claim 2, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

4. A semiconductor device according to claim 3, wherein the low-elastic resin layer is made from one of polyimide, benzocyclamatebutene, and polybenzaoxazole, and the high-elastic resin layer is made from epoxy resin.

5. A semiconductor device according to claim 2, wherein the surface of the low-elastic resin layer has sloping sections at the vicinities of the bump electrodes.

6. A semiconductor device according to claim 5, wherein thickness of the sloping sections decreases with increasing distance from the bump electrodes.

7. A semiconductor device according to claim 5, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

8. A semiconductor device according to claim 7, wherein the low-elastic resin layer is made from one of polyimide, benzocyclamatebutene, and polybenzaoxazole, and the high-elastic resin layer is made from epoxy resin.

9. A semiconductor device according to claim 1, wherein the surface of the low-elastic resin layer has sloping sections at the vicinities of the bump electrodes.

10. A semiconductor device according to claim 9, wherein thickness of the sloping sections decreases with increasing distance from the bump electrodes.

11. A semiconductor device according to claim 9, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

12. A semiconductor device according to claim 11, wherein the low-elastic resin layer is made from one of polyimide, benzocyclamatebutene, and polybenzaoxazole, and the high-elastic resin layer is made from epoxy resin.

13. A semiconductor device according to claim 12, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

14. A semiconductor device according to claim 13, wherein the low-elastic resin layer is made from one of polyimide, benzocyclamatebutene, and polybenzaoxazole, and the high-elastic resin layer is made from epoxy resin.

15. A semiconductor device having bump electrodes electrically connected to connection pads formed on a semiconductor chip, tips of the bump electrodes exposing at a surface of a sealing resin film formed on a surface of the semiconductor chip, wherein the sealing resin film is comprised of a low-elastic resin layer formed on the surface of the semiconductor chip and a high-elastic resin layer formed on a surface of the low-elastic resin layer and having an elastic coefficient higher than that of the low-elastic resin layer, and the surface of the low-elastic resin layer has sloping sections at the vicinities of the bump electrodes, thickness of the sloping sections decreasing with distance from the bump electrodes.

16. A semiconductor device according to claim 13, wherein a ratio of a thickness of the low-elastic resin layer to the thickness of the high-elastic resin layer is between 3.5 and 8.

17. A semiconductor device according to claim 16, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

18. A semiconductor device according to claim 17, wherein the low-elastic resin layer is made from one of polyimide, benzocyclamatebutene, and polybenzaoxazole, and the high-elastic resin layer is made from epoxy resin.

19. A semiconductor device according to claim 15, wherein the low-elastic resin layer is comprised of a resin with a thermal expansion coefficient which is between 8 ppm and 180 ppm and a room-temperature bending elastic modulus which is between 0.5 Gpa and 4 Gpa, and the high-elastic resin layer is comprised of a resin with a thermal expansion coefficient which is between 5 ppm and 13 ppm and a room-temperature bending elastic modulus which is between 9 Gpa and 21 GPa.

20. A semiconductor device according to claim 19, wherein the low-elastic resin layer is made from one of polyimide, benzocyclamatebutene, and polybenzaoxazole, and the high-elastic resin layer is made from epoxy resin.

21. A semiconductor device comprising:

a semiconductor chip having electrode pads formed on a major surface thereof;

a plurality of bump electrodes formed over the major surface and electrically coupled to the electrode pads, each of the bump electrodes having top and side surfaces; and a sealing resin covering the major surface and the side surfaces of the bump electrodes so as to expose the top surfaces of the bump electrodes, wherein the sealing resin is comprised of a first layer formed over the major surface and a second layer formed on the first layer, the second layer having an elastic coefficient higher than that of the first layer and a thickness between 5 micrometers and 45 micrometers.

22. A semiconductor device according to claim 21, wherein a ratio of the thickness of the second layer to a thickness of the first layer is between 3.5 and 8.

23. A semiconductor device according to claim 21, wherein the first layer has an inclination surface at each of regions adjacent to the bump electrodes.

24. A semiconductor device according to claim 23, wherein a thickness of the first layer at each of the regions where the inclination surface is provided decreases with increasing distance from the bump electrode.

25. A semiconductor device comprising:

a semiconductor chip having electrode pads formed on a major surface thereof;

a plurality of bump electrodes formed over the major surface and electrically coupled to the electrode pads, each of the bump electrodes having top and side surfaces; and a sealing resin covering the major surface and the side surfaces of the bump electrodes so as to expose the top surfaces of the bump electrodes, wherein the sealing resin is comprised of a first layer formed over the major surface and a second layer formed on the first layer, wherein the second layer has an elastic coefficient higher than that of the first layer and wherein the first layer has an inclination surface at each of regions adjacent to the bump electrodes.

26. A semiconductor device according to claim 25, wherein a ratio of a thickness of the second layer to a thickness of the first layer is between 3.5 and 8.

27. A semiconductor device according to claim 25, wherein a thickness of the first layer at each of regions where the inclination surface is provided decrease with increasing distance from the bump electrodes.

* * * * *